United States Patent
Chang et al.

(10) Patent No.: US 12,510,230 B2
(45) Date of Patent: Dec. 30, 2025

(54) ELECTRONIC DEVICE

(71) Applicant: InnoLux Corporation, Miao-Li County (TW)

(72) Inventors: Yen-Chi Chang, Miao-Li County (TW); Min-Chien Sung, Miao-Li County (TW); Po-Tsun Kuo, Miao-Li County (TW); Yu-Kai Wang, Miao-Li County (TW); Wei-Lun Hsiao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 400 days.

(21) Appl. No.: 18/177,279

(22) Filed: Mar. 2, 2023

(65) Prior Publication Data

US 2023/0213173 A1    Jul. 6, 2023

(30) Foreign Application Priority Data

Apr. 1, 2022 (CN) .......................... 202210347550.5

(51) Int. Cl.
| | |
|---|---|
| *H10K 50/86* | (2023.01) |
| *F21V 11/14* | (2006.01) |
| *H10H 20/855* | (2025.01) |
| *H10K 59/80* | (2023.01) |
| *H10K 59/10* | (2023.01) |

(52) U.S. Cl.
CPC ........... *F21V 11/14* (2013.01); *H10H 20/855* (2025.01); *H10K 50/865* (2023.02); *H10K 59/8792* (2023.02); *H10K 59/221* (2023.02)

(58) Field of Classification Search
CPC ............... H10H 20/855; H10K 50/865; H10K 59/8792; H10K 59/221; F21V 11/14
See application file for complete search history.

(56) References Cited

U.S. PATENT DOCUMENTS

| | | | | |
|---|---|---|---|---|
| 2015/0042934 A1* | 2/2015 | Kanno | ................. | G02B 5/0247 349/112 |
| 2020/0012837 A1* | 1/2020 | Lee | ......................... | H04N 23/72 |
| 2021/0375969 A1* | 12/2021 | Wu | ....................... | G06V 10/143 |

* cited by examiner

*Primary Examiner* — Thanh Y. Tran
(74) *Attorney, Agent, or Firm* — McClure, Qualey & Rodack, LLP

(57) ABSTRACT

An electronic device is provided. The electronic device includes a light-emitting element, a cover plate and a light-shielding layer. The cover plate is disposed on the light-emitting element. The light-shielding layer is disposed on a side of the cover plate adjacent to the light-emitting element. The light-shielding layer has an icon area, and the light-shielding layer has a plurality of openings in the icon area. In addition, the plurality of openings have an aperture ratio in the icon area, and the aperture ratio is greater than 0% and less than or equal to 20%.

19 Claims, 7 Drawing Sheets

ELECTRONIC DEVICE

CROSS REFERENCE TO RELATED APPLICATIONS

This application claims the benefit of China Application No. 202210347550.5, filed Apr. 1, 2022, the entirety of which is incorporated by reference herein.

BACKGROUND

Technical Field

The present disclosure is related to an electronic device, and in particular it is related to an electronic device including a light-shielding layer having an icon area.

Description of the Related Art

Electronic products including display panels, such as tablet computers, notebook computers, smartphones, displays and televisions, have become an indispensable necessity in modern society. With the rapid development of these consumer electronics, consumers have high expectations regarding the quality, functionality, or price of these products.

Icons or logos are usually printed on electronic devices using ink in a screen printing process, an inkjet printing process, a lithography process, or a similar process. However, the icons or logos formed using these materials and these methods cannot be rendered invisible or sent to the background (for example, in an unused state, the icons or logos are not displayed), and the color of the icons or logos cannot be changed in real time.

As described above, the existing electronic devices with icons or logos do not meet the design requirements in appearance. The development of a structural design that can further improve the appearance of electronic devices is still one of the current research topics in the industry.

SUMMARY

In accordance with some embodiments of the present disclosure, an electronic device is provided. The electronic device includes a light-emitting element, a cover plate and a light-shielding layer. The cover plate is disposed on the light-emitting element. The light-shielding layer is disposed on a side of the cover plate adjacent to the light-emitting element. The light-shielding layer has an icon area, and the light-shielding layer has a plurality of openings in the icon area. In addition, the plurality of openings have an aperture ratio in the icon area, and the aperture ratio is greater than 0% and less than or equal to 20%.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
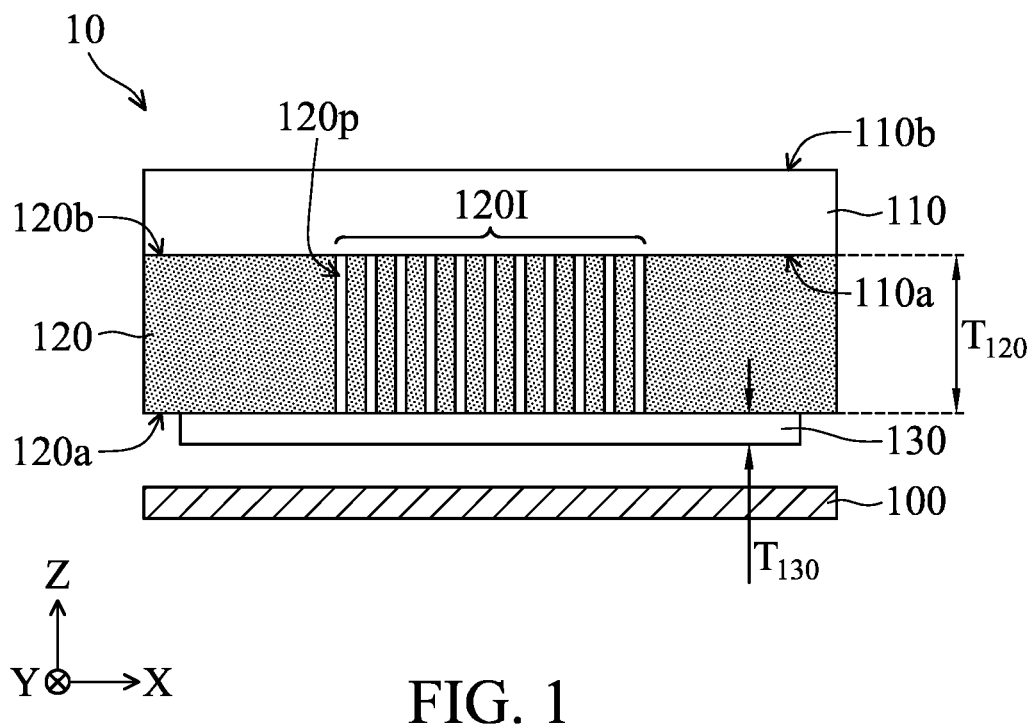
FIG. 1 is a cross-sectional diagram of an electronic device in accordance with some embodiments of the present disclosure.

The electronic device according to the present disclosure is described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, an electronic device is provided, which includes a light-shielding layer having an icon area, and the openings in the icon area has an aperture ratio in a specific range, so that the icon or logo on the electronic device can be rendered invisible or backgrounded (for example, in an unused state, no icon or logo is displayed) as required. Furthermore, in accordance with some embodiments of the present disclosure, the electronic device can also achieve real-time change of the color of the icon or logo.

In accordance with the embodiments of the present disclosure, the electronic device may include a display device, a backlight device, a touch device, an antenna device, a sensing device or a tiled device, but it is not limited thereto. The electronic device may be a bendable or flexible electronic device. The display device may be a non-self-luminous display device or a self-luminous display device. The antennal device may be a liquid-crystal type antenna device or a non-liquid-crystal type antenna device. The sensing device may be a sensing device for sensing capacitance, light, heat or ultrasonic, but it is not limited thereto. Moreover, the electronic device may, for example, include liquid crystal, quantum dot (QD), fluorescence, phosphor, another suitable material, or a combination thereof. The electronic device may include electronic components. The electronic components may include passive components and active components, such as capacitors, resistors, inductors, diodes, transistors, and the like. The diodes may include light-emitting diodes or photodiodes. The light-emitting diodes may, for example, include organic light-emitting diodes (OLEDs), mini light-emitting diodes (mini LEDs), micro light-emitting diodes (micro LEDs) or quantum dot light-emitting diodes (quantum dot LEDs), but it is not limited to. In accordance with some embodiments, the electronic device may include a panel and/or a backlight module. The panel may include, for example, a liquid-crystal panel or another self-luminous panel, but it is not limited thereto. The tiled device may be, for example, a display tiled device or an antenna tiled device, but it is not limited thereto. It should be noted that the electronic device can be any combination and arrangement of the aforementioned, but it is not limited thereto. In the following description, a display device is used as an example of an electronic device to illustrate the content of the present disclosure, but the present disclosure is not limited thereto.

Please refer to FIG. 1, which is a cross-sectional diagram of an electronic device 10 in accordance with some embodiments of the present disclosure. For clarity, some elements of the electronic device 10 are omitted in the figure, and only some elements are schematically shown. In accordance with some embodiments, additional features may be added to the electronic device 10 described below. In accordance with some other embodiments, some features of the electronic device 10 described below may be replaced or omitted.

As shown in FIG. 1, the electronic device 10 may include a light-emitting element 100, a cover plate 110 and a light-shielding layer 120, and the cover plate 110 and the light-shielding layer 120 may be disposed on the light-emitting element 100. Specifically, the cover plate 110 has a first side 110*a* adjacent to the light-emitting element 100 and a second side 110*b* farther away from the light-emitting element 100. The light-shielding layer 120 may be disposed on the first side 110*a* of the cover plate 110 adjacent to the light-emitting element 100. Furthermore, the cover plate 110 may be disposed on the light-shielding layer 120. In accordance with some embodiments, the cover plate 110 may be directly disposed on the light-shielding layer 120 and in contact with it. In accordance with some other embodiments, there may be other layers between the cover plate 110 and the light-shielding layer 120, and the cover plate 110 may be not in direct contact with the light-shielding layer 120.

In accordance with some embodiments, the light-emitting element 100 may include light-emitting diodes (LEDs), such as mini light-emitting diodes (mini LEDs), micro light-emitting diodes (micro LEDs), organic light-emitting diodes (OLEDs), electroluminescence, another suitable light-emitting element, or a combination thereof, but the present disclosure is not limited thereto.

In accordance with some embodiments, the light-emitting element 100 may be a light-emitting element independent of the panel or the backlight source of the panel, and can independently control the brightness or color, etc., but the present disclosure is not limited thereto. Specifically, in accordance with some embodiments, the light-emitting element 100 may correspond to one or more pixels, and the pixel may include a suitable number of sub-pixels. In accordance with some embodiments, a pixel or sub-pixel may have a single color or multiple colors, for example, a three-color pixel with red, green, and blue, or a four-color pixel with red, green, blue, and white, or another suitable color or another suitable number of colors, but the present disclosure is not limited thereto.

It should be noted that in a general process of using ink to produce color icons or logos, the color of the icons or logos depends on the ink, and the ink needs to go through processes such as blending, printing or lithography to complete the color change. In contrast, according to the embodiments of the present disclosure, the light-emitting element 100 can adjust the color coordinates and change the color of light by controlling pixels to achieve real-time changes in the color of icons or logos, which can also reduce manufacturing costs or increase product variability.

The cover plate 110 may be used to protect the below structures such as the light-shielding layer 120. In accordance with some embodiments, the cover plate 110 may provide a surface for touch, control and operation, but the present disclosure is not limited thereto.

The cover plate 110 may include a flexible substrate, a rigid substrate, or a combination thereof, but it is not limited thereto. In accordance with some embodiments, the material of the cover plate 110 may include glass, quartz, sapphire, ceramic, polyimide (PI), polycarbonate (PC), polyethylene terephthalate (PET), polypropylene (PP), another suitable material or a combination thereof, but it is not limited thereto.

Moreover, the light-shielding layer 120 may prevent the light generated from the light-emitting element 100 from penetrating to the cover plate 110. As shown in FIG. 1, the light-shielding layer 120 may have an icon area 120I, and the light-shielding layer 120 may have a plurality of openings 120p in the icon area 120I. The light generated by the light-emitting element 100 can pass through the light-shielding layer 120 via the openings 120p. Moreover, the plurality of openings 120p have an aperture ratio in the icon area 120I, and the aperture ratio may be greater than 0% and less than or equal to 20% (that is, 0%<aperture ratio≤20%), or greater than 0% and less than or equal to 10%. For example, the aperture ratio may be 1%, 2%, 3%, 4%, 5%, 6%, 7%, 8%, 9%, 10%, 11%, 12%, 13%, 14%, 15%, 16% %, 17%, 18% or 19%.

Figure 2:
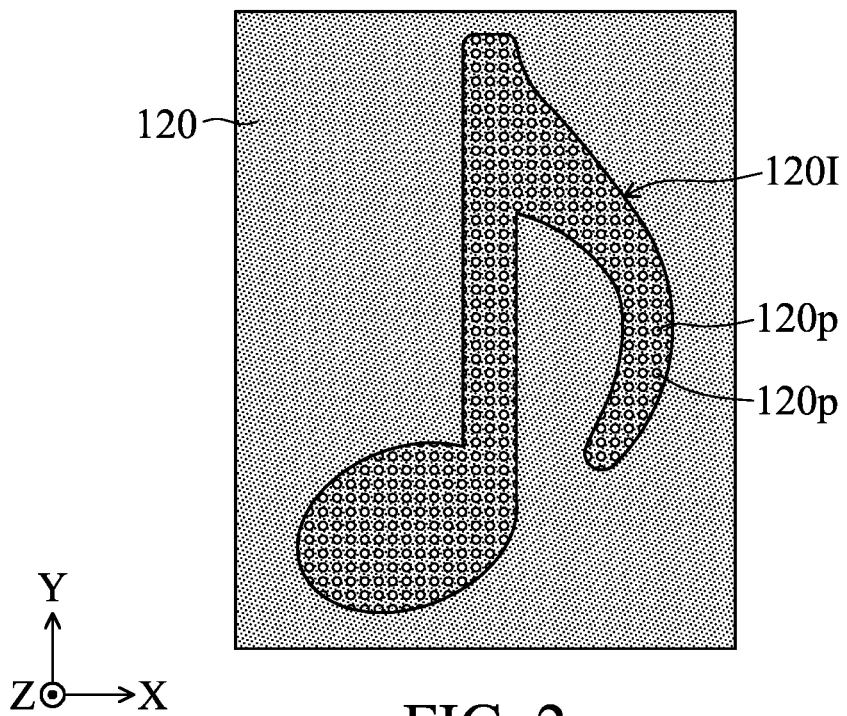
FIG. 2 is a top-view diagram of some components of an electronic device in accordance with some embodiments of the present disclosure.

Specifically, please refer to FIG. 2, which is a top-view diagram of the light-shielding layer 120 of the electronic device 10 in accordance with some embodiments of the present disclosure. As shown in FIG. 2, the light-shielding layer 120 has the icon area 120I, and the light-shielding layer 120 has a plurality of openings 120p in the icon area 120I. In accordance with some embodiments of the present disclosure, the aperture ratio is defined as the total area of the plurality of openings 120p divided by the total area of the light-shielding layer 120 plus the total area of the plurality of openings 120p, as shown in the following formula 1:

The aperture ratio (%)=total area of the plurality of openings/(total area of the plurality of openings+total area of the light-shielding layer)× 100%     [formula 1].

The total area of the plurality of openings 120p refers to the total area of the plurality of openings 120p on a plane (for example, the X-Y plane in the drawing) perpendicular to the normal direction of the cover plate 110 (for example, the Z direction in the drawing). The total area of the light-shielding layer 120 refers to the total area of the light-shielding layer 120 in the icon area 120I on a plane (for example, the X-Y plane in the drawing) perpendicular to the normal direction of the cover plate 110 (for example, the Z direction in the drawing).

It should be noted that when the aperture ratio of the plurality of openings 120p in the icon area 120I is within a certain range (for example, greater than 0% and less than or equal to 20%), the icon area 120I can be rendered invisible or backgrounded as required (for example, when the electronic device 10 is not in use, the pattern of the icon area 120I cannot be seen visually). Specifically, the brightness of the light-emitting element 100 can be reduced or the light-emitting element 100 can be turned off to render the pattern of the icon area 120I invisible or backgrounded.

Furthermore, the expected transmittance of the light passing through the cover plate 110 can be calculated according to the aperture ratio of the plurality of openings 120p in the icon area 120I. In accordance with some embodiments of the present disclosure, the expected transmittance of the cover plate is defined as the aperture ratio multiplied by the transmittance of the cover plate 110, as shown in the following formula 2:

Expected transmittance of the cover plate (%)=aperture ratio×transmittance of the cover plate     [formula 2].

In accordance with some embodiments, the expected transmittance of the cover plate 110 may be greater than 0% and less than or equal to 20% (that is, 0%<expected transmittance of the cover plate≤20%). For example, the expected transmittance of the cover plate 110 may be 1%, 2%, 3%, 4%, 5%, 6%, 7%, 8%, 9%, 10%, 11%, 12%, 13%, 14%, 15%, 16%, 17%, 18% or 19%.

When the expected transmittance of the light passing through the cover plate 110 is within a certain range (for example, greater than 0% and less than or equal to 20%), the icon area 120I can have a good invisible or backgrounded effect. When the brightness of the light-emitting element 100 is reduced or the light-emitting element 100 is turned off, the pattern of the icon area 120I cannot be seen visually.

The detailed calculation method of the transmittance of the opening 120p in different aspects will be further described in FIG. 5A to FIG. 5B and FIG. 6A to FIG. 6B.

In addition, the light-shielding layer 120 has a thickness $T_{120}$. In accordance with some embodiments, the thickness $T_{120}$ may be between 1 micrometer and 20 micrometers (i.e. 1 μm≤thickness $T_{120}$≤20 μm), or between 8 micrometers and 15 micrometers, for example, 9 micrometers, 10 micrometers, 11 micrometers, 12 micrometers, 13 micrometers or 14 micrometers.

In accordance with the embodiments of the present disclosure, the thickness $T_{120}$ refers to the maximum thickness of the light-shielding layer 120 in the normal direction of the cover plate 110 (for example, the Z direction in the drawing).

It should be understood that, according to embodiments of the present disclosure, a scanning electron microscope (SEM), an optical microscope (OM), a film thickness profiler (α-step), an ellipsometer or another suitable method may be used to measure the thickness, width, or height of each element, or the spacing or distance between elements. Specifically, in accordance with some embodiments, a scanning electron microscope may be used to obtain a cross-sectional image including the elements to be measured, and the thickness, width, or height of each element, or the spacing or distance between elements in the image can be measured.

In accordance with some embodiments, the material of the light-shielding layer 120 may include black photoresist, black printing ink, black resin, metal, carbon black material, resin material, photosensitive material, another suitable material, or a combination thereof, but it is not limited thereto.

In accordance with some embodiments, the light-shielding layer 120 may be formed by a coating process, a deposition process, a printing process, an evaporation process, a sputtering process, another suitable process, or a combination thereof. Then, the light-shielding layer 120 may be patterned by a laser ablation process to form a plurality of openings 120p. Furthermore, the openings 120p with a specific shape, pore diameter or pitch can be formed in the light-shielding layer 120 by adjusting the parameters of the laser ablation process.

Please refer to FIG. 3A to FIG. 3D, which are partial top-view diagrams of the light-shielding layer 120 of the electronic device 10 in accordance with some embodiments of the present disclosure. It should be understood that, for convenience of description, only four openings 120p are shown in the figure. According to different embodiments, the light-shielding layer 120 may have other suitable number of openings 120p.

Figure 3A:
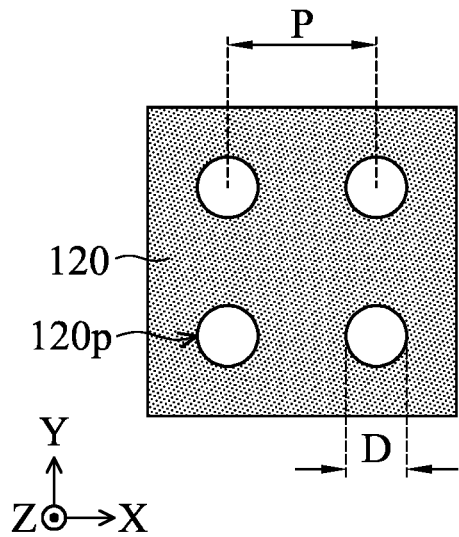
FIG. 3A to FIG. 3D are top-view diagrams of some components of an electronic device in accordance with some embodiments of the present disclosure.
Figure 3B:
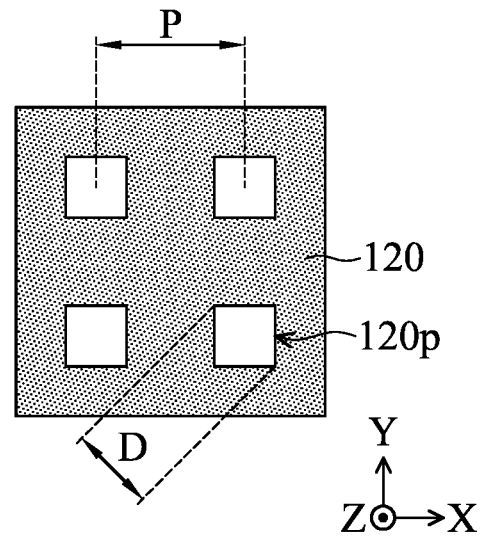
Figure 3C:
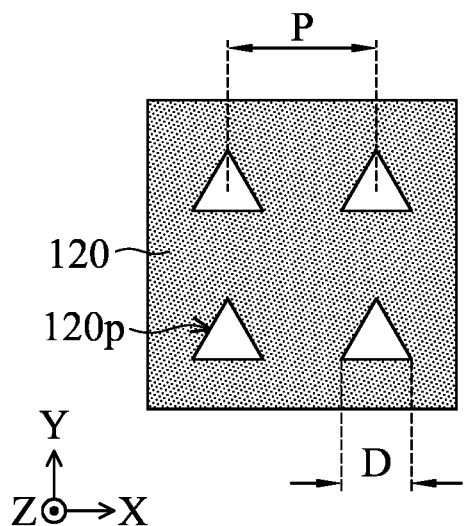
Figure 3D:
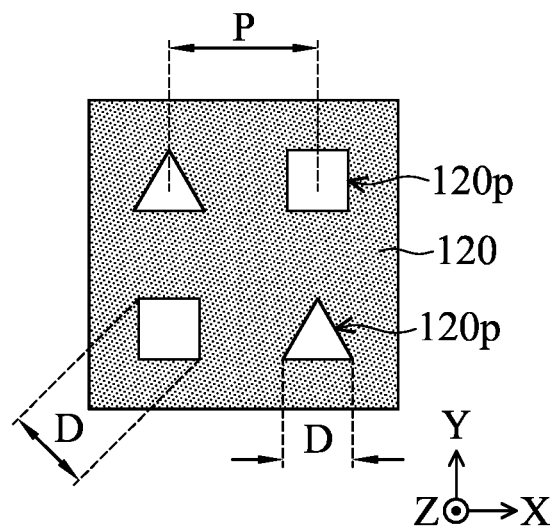

As shown in FIG. 3A to FIG. 3C, in accordance with some embodiments, the opening 120p of the light-shielding layer 120 may have a circular, rectangular or triangular shape in a top view, but it is not limited thereto. According to different embodiments, the opening 120p may have any other suitable shape, for example, an ellipse, other polygons, irregular shapes and the like. Moreover, in accordance with some embodiments, the plurality of openings 120p of the light-shielding layer 120 may all have the same shape. As shown in FIG. 3D, in accordance with some other embodiments, the light-shielding layer 120 may have a plurality of openings 120p with different shapes.

Furthermore, the opening 120p has a pore diameter D. In accordance with some embodiments, the pore diameter D of the opening 120p may be between 20 micrometers and 40 micrometers (i.e., 20 μm≤pore diameter D≤40 μm), for example, 25 micrometers, 30 micrometers or 35 micrometers. In accordance with the embodiments of the present disclosure, the pore diameter D refers to, on the side of the light-shielding layer 120 adjacent to the cover plate 110 (for example, the second side 120b shown in FIG. 1), the distance between the farthest two end points of the contour edge of the opening 120p.

In addition, there is a pitch P between two adjacent openings 120p among the plurality of openings 120p. In accordance with some embodiments, the pitch P between two adjacent openings 120p may be between 85 micrometers and 140 micrometers (i.e. 85 μm≤pitch P≤140 μm), for example, 90 micrometers, 100 micrometers, 110 micrometers, 120 micrometers or 130 micrometers. In accordance with the embodiments of the present disclosure, the pitch P refers to the distance between the centers of two adjacent openings 120p. The center of opening 120p may be a geometric center. For example, if the opening 120p is circular, the center of the opening 120p may be the center of the circle; if the opening 120p has a shape similar to rectangular or square, the center may be the intersection of two diagonal lines; if the opening 120p is an irregular shape and the center cannot be defined in the aforementioned manner, a smallest circle that can surround the opening can be drawn, and the center of the smallest circle can be defined as the center of the opening, but the present disclosure is not limited thereto.

It should be noted that when the openings 120p of the light-shielding layer 120 have a specific range of pore diameter and pitch (for example, 20 μm≤pore diameter D≤40 and 85 μm≤pitch P≤140 μm), the pattern displayed in the icon area 120I can have better resolution degree while maintaining a good invisible or backgrounded effect.

Figure 4A:
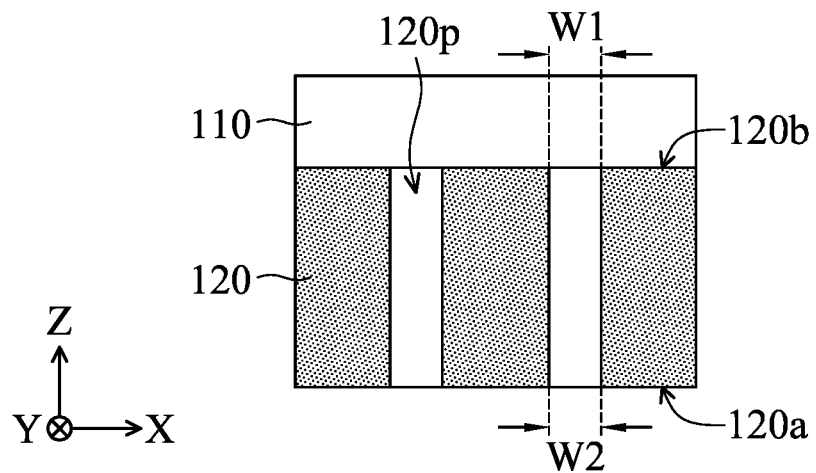
FIG. 4A to FIG. 4C are cross-sectional diagrams of some components of an electronic device in accordance with some embodiments of the present disclosure.
Figure 4B:
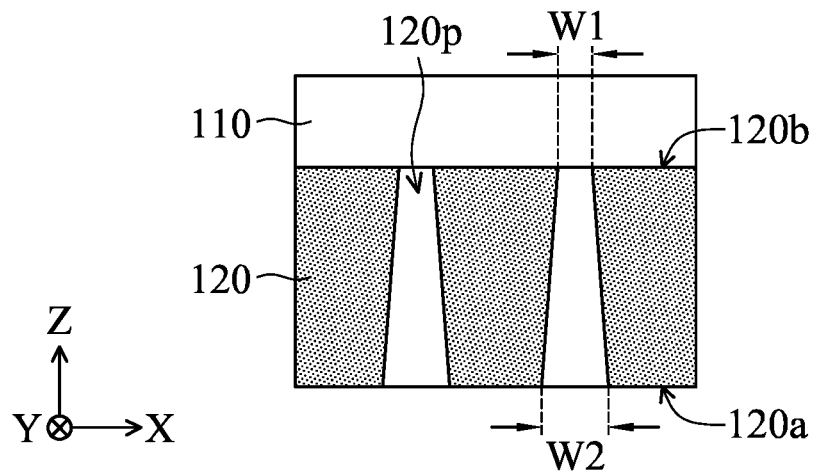
Figure 4C:
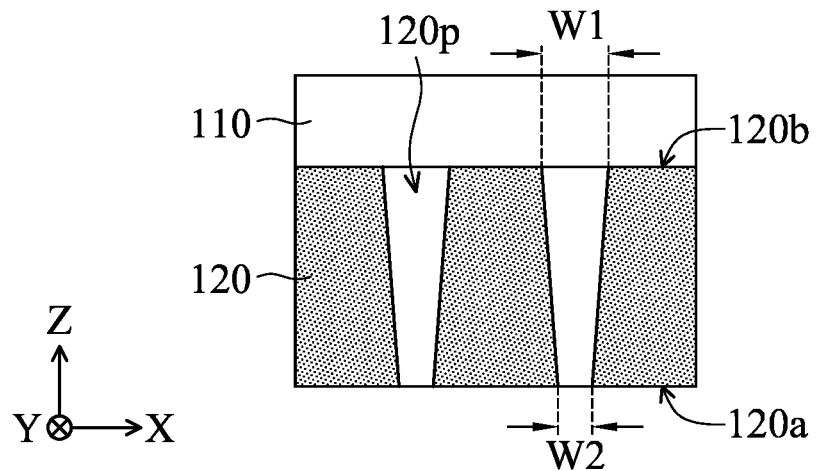

Please refer to FIG. 4A to FIG. 4C, which are partial cross-sectional diagrams of the cover plate 110 and the light-shielding layer 120 of the electronic device 10 in accordance with some embodiments of the present disclosure.

The opening 120p of the light-shielding layer 120 has a top width W1 and a bottom width W2. As shown in FIG. 4A, in accordance with some embodiments, the top width W1 of the opening 120p may be substantially equal to the bottom width W2. As shown in FIG. 4B and FIG. 4C, in accordance with some embodiments, the top width W1 of the opening 120p may be different from the bottom width W2. In accordance with some embodiments, the top width W1 of the opening 120p may be less than the bottom width W2. In accordance with some embodiments, the top width W1 of the opening 120p may be greater than the bottom width W2.

In accordance with the embodiments of the present disclosure, the light-shielding layer 120 has the first side 120a adjacent to the light-emitting element 100 and the second side 120b farther away from the light-emitting element 100. The top width W1 of the opening 120p refers to the maximum width of the opening 120p on the second side 120b of the light-shielding layer 120 in a direction perpendicular to the normal direction of the cover plate 110 (for example, the X direction in the drawing). Moreover, the bottom width W2 of the opening 120p refers to the maximum width of the opening 120p on the first side 120a of the light-shielding layer 120 in a direction perpendicular to the normal direction of the cover plate 110 (for example, the X direction in the drawing).

Next, please refer to FIG. 1 again. In accordance with some embodiments, the electronic device 10 may further include a glue layer 130. The glue layer 130 may be disposed on the first side 120a of the light-shielding layer 120 adjacent to the light-emitting element 100. The glue layer 130 may be disposed between the light-emitting element 100 and the light-shielding layer 120. Moreover, as shown in FIG. 1, in accordance with some embodiments, there may be a gap between the light-emitting element 100 and the light-shielding layer 120, and the light-emitting element 100 may be not in contact with the light-shielding layer 120. However, in accordance with some other embodiments, the light-shielding layer 120 may be adhered on the light-emitting element 100, and there may be no gap between the light-emitting element 100 and the light-shielding layer 120. In addition, the glue layer 130 can reduce light reflection, so that the pattern of the icon area 120I can be less obvious.

Furthermore, the glue layer 130 has a thickness $T_{130}$. In accordance with some embodiments, the thickness $T_{130}$ of the glue layer 130 may be between 200 micrometers and 1000 micrometers (i.e. 200 micrometers≤thickness $T_{130}$≤1000 micrometers), for example, 300 micrometers, 400 micrometers, 500 micrometers, 600 micrometers, 700 micrometers, 800 micrometers or 900 micrometers. In accordance with the embodiments of the present disclosure, the thickness $T_{130}$ refers to the maximum thickness of the glue layer 130 in the normal direction of the cover plate 110 (for example, the Z direction in the drawing).

In accordance with some embodiments, by adjusting the thickness range of the light-shielding layer 120 and the glue layer 130 (for example, 5 µm≤thickness $T_{120}$≤20 µm, 200 µm≤thickness $T_{130}$≤1000 µm), the effect of rendering the pattern invisible or backgrounded in the icon area 120I can be adjusted. In general, when the thickness of the light-shielding layer 120 and the glue layer 130 are thicker, the electronic device 10 can maintain the effect of rendering the pattern invisible or backgrounded under higher brightness.

In accordance with some embodiments, the glue layer 130 may be a transparent glue layer. In accordance with some embodiments, the glue layer 130 may include a light-curable adhesive material, a heat-curable adhesive material, a light-heat-curable adhesive material, another suitable material, or a combination thereof, but it is not limited thereto. For example, in accordance with some embodiments, the glue layer 130 may include optical clear adhesive (OCA), optical clear resin (OCR), pressure sensitive adhesive (PSA), another suitable material, or a combination thereof, but it is not limited thereto.

In accordance with some embodiments, the glue layer 130 may be formed by a coating process, a deposition process, a printing process, another suitable process, or a combination thereof.

Figure 5A:
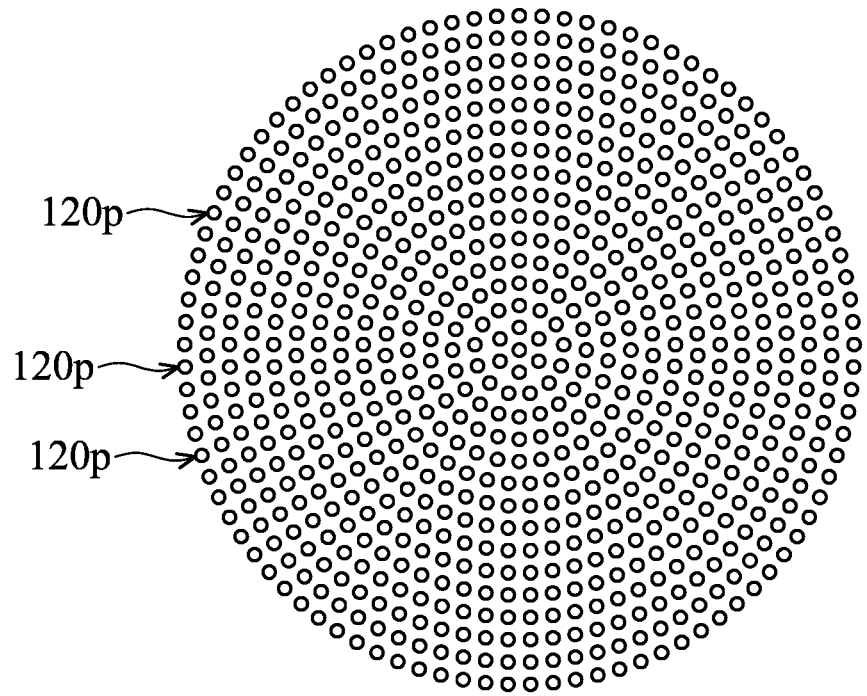
FIG. 5A and FIG. 5B are top-view diagrams of some components of an electronic device in accordance with some embodiments of the present disclosure.
Figure 5B:
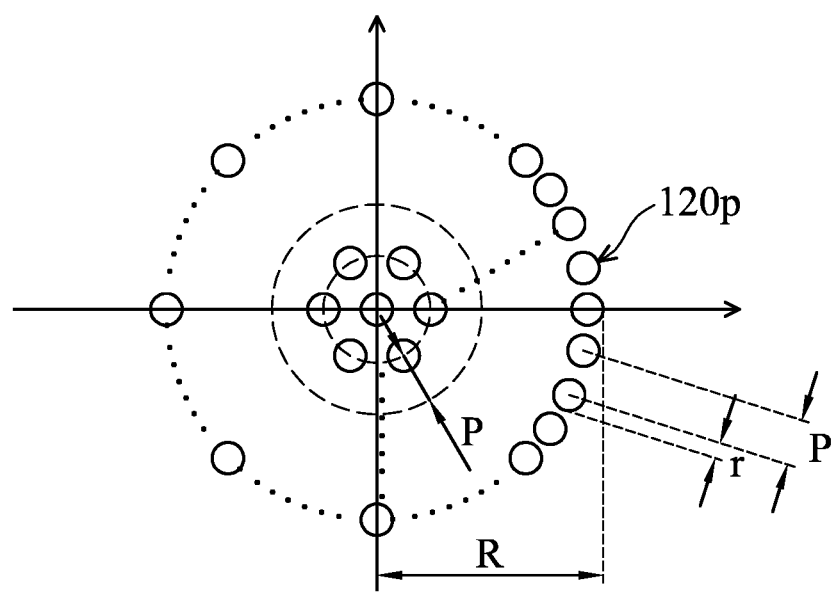

Next, please refer to FIG. 5A and FIG. 5B, which are top-view diagrams of the openings 120p of the electronic device 10 in accordance with some embodiments of the present disclosure. The calculation method of the expected transmittance of the cover plate will be described below with reference to FIG. 5A and FIG. 5B.

In this embodiment, the plurality of openings 120p in the icon area 120I of the light-shielding layer 120 are arranged in concentric circles, and the expected transmittance of light passing through the cover plate 110 can be calculated by the following formula 3:

The expected transmittance of the cover plate $$(\%) = \frac{2\pi r^2}{R^2} \frac{\left(1 + \frac{R}{P}\right)\frac{R}{P}}{2} \times \text{the transmittance of the cover plate.} \quad \text{[formula 3]}$$

In formula 3, $$\frac{2\pi r^2}{R^2} \frac{\left(1 + \frac{R}{P}\right)\frac{R}{P}}{2}$$

is the aperture ratio of the plurality of openings 120p in the icon area 120I, r represents the radius of the opening 120p, P represents the pitch between two adjacent openings 120p, and R represents the radius of the concentric circles formed by the plurality of openings 120p, that is, the radius of the icon area 120I.

Figure 6A:
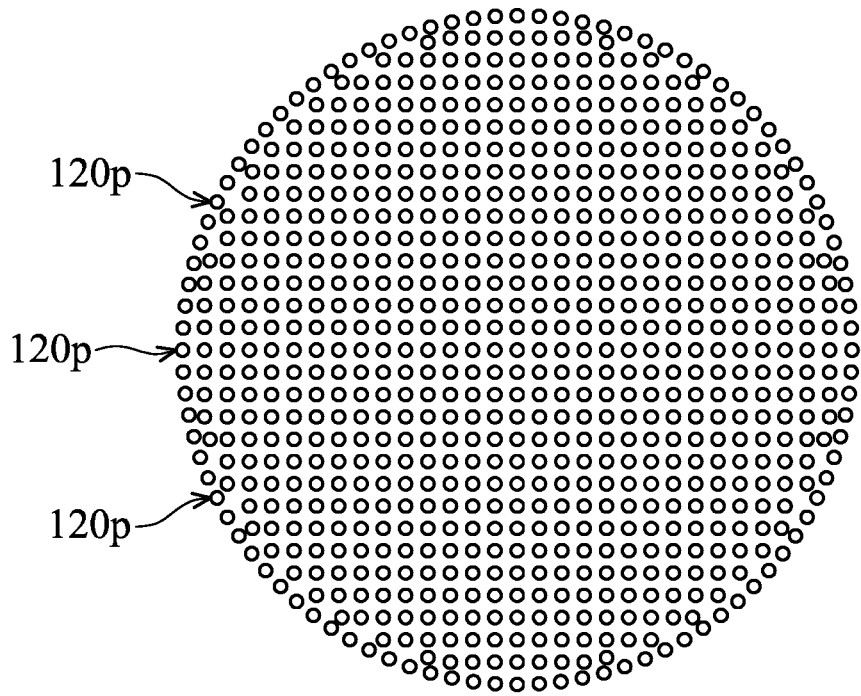
FIG. 6A and FIG. 6B are top-view diagrams of some components of an electronic device in accordance with some embodiments of the present disclosure.
Figure 6B:
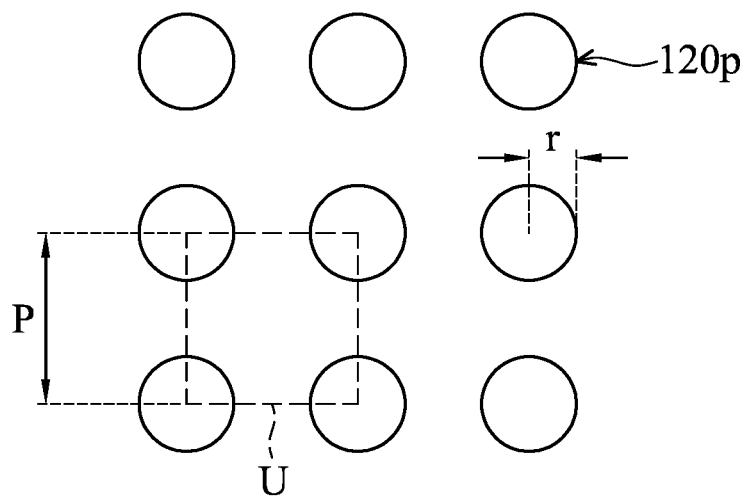

Please refer to FIG. 6A and FIG. 6B, which are top-view diagrams of the opening 120p of the electronic device 10 in accordance with some embodiments of the present disclosure, and FIG. 6B is a partial enlarged view of FIG. 6A. The calculation method of the expected transmittance of the cover plate will be described below with reference to FIG. 6A and FIG. 6B.

In this embodiment, the plurality of openings 120p in the icon area 120I of the light-shielding layer 120 are arranged in an array, and the expected transmittance of light passing through the cover plate 110 can be calculated by the following formula 4:

The expected transmittance of the cover plate $$(\%) = \frac{\pi r^2}{P^2} \times \text{the transmittance of the cover plate.} \quad \text{[formula 4]}$$

In formula 4, $$\frac{\pi r^2}{P^2}$$

is the aperture ratio of the plurality of openings 120p in the icon area 120I, r represents the radius of the opening 120p, and P represents the pitch between two adjacent openings 120p. Furthermore, as shown in FIG. 6B, in accordance with some embodiments, the expected transmittance of the cover plate can be calculated in a unit area U of the array. The unit area U of the array can be a square area whose length and width are both the pitch P.

Figure 7A:
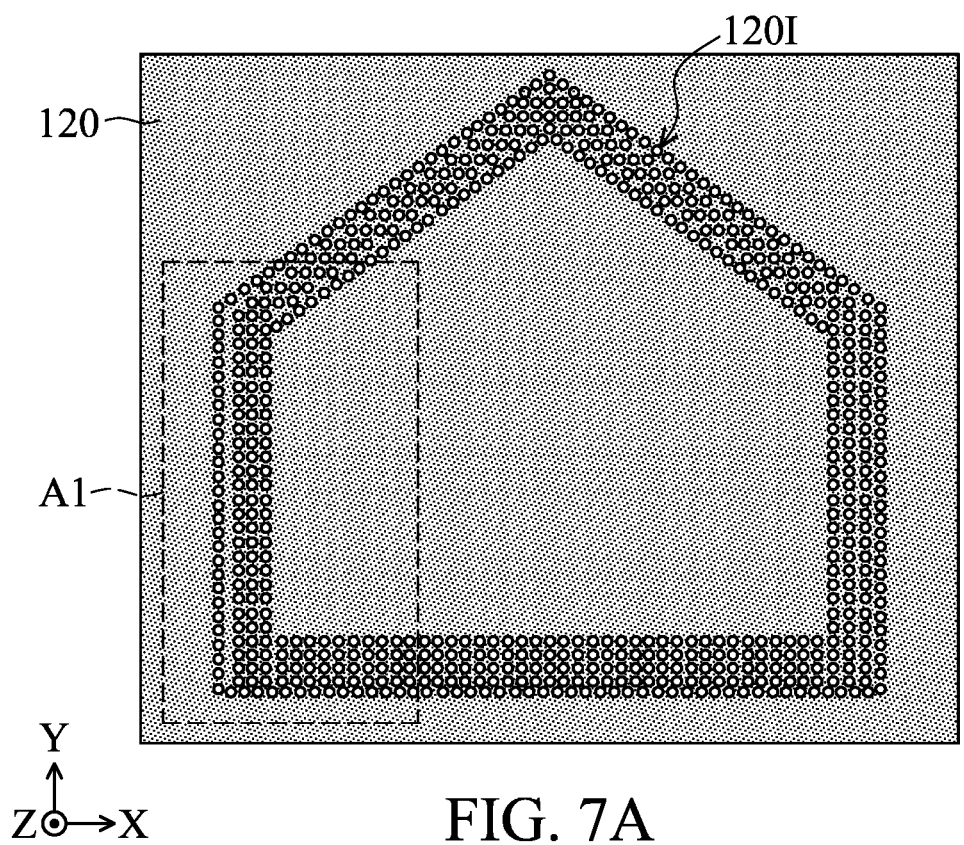
FIG. 7A is a top-view diagram of some components of an electronic device in accordance with some embodiments of the present disclosure.
Figure 7B:
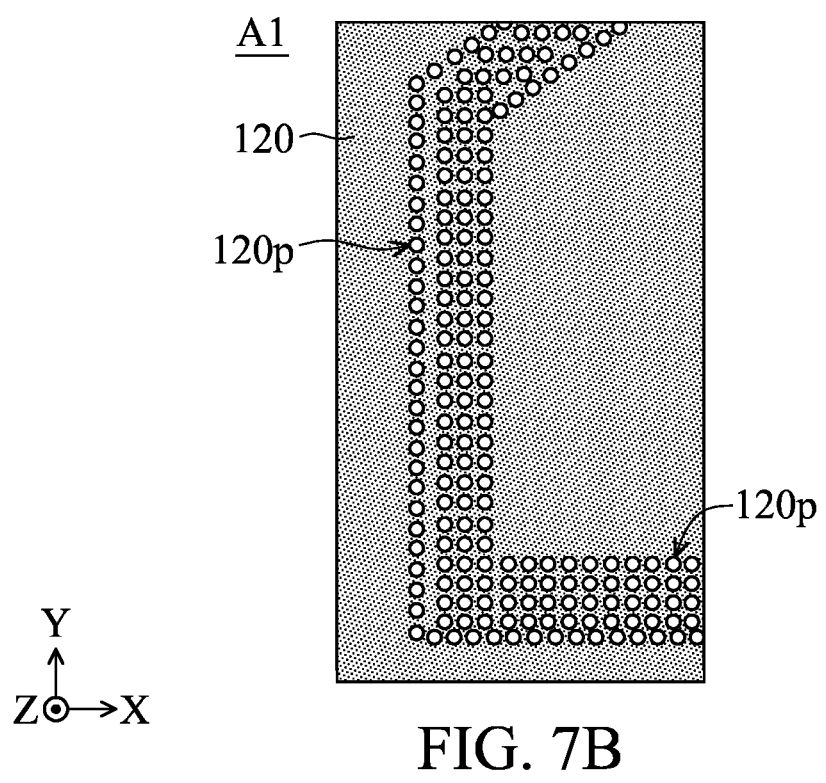
FIG. 7B is an enlarged structural diagram of region A1 of FIG. 7A in accordance with some embodiments of the present disclosure.
Figure 8A:
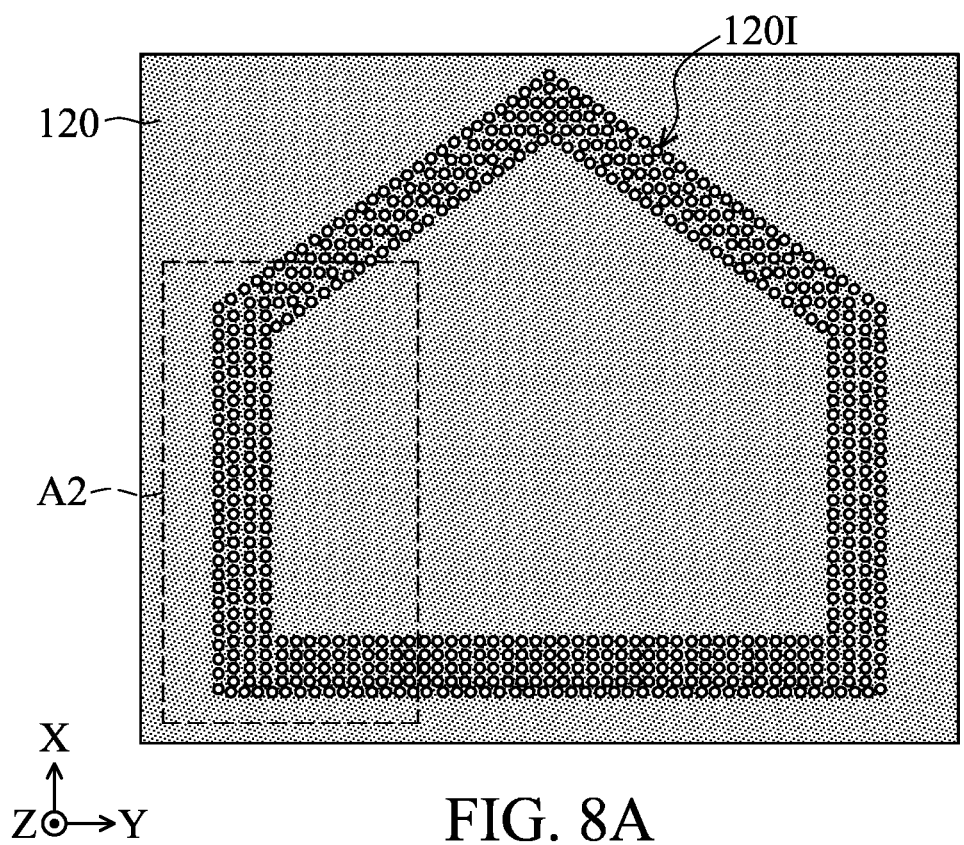
FIG. 8A is a top-view diagram of some components of an electronic device in accordance with some embodiments of the present disclosure.
Figure 8B:
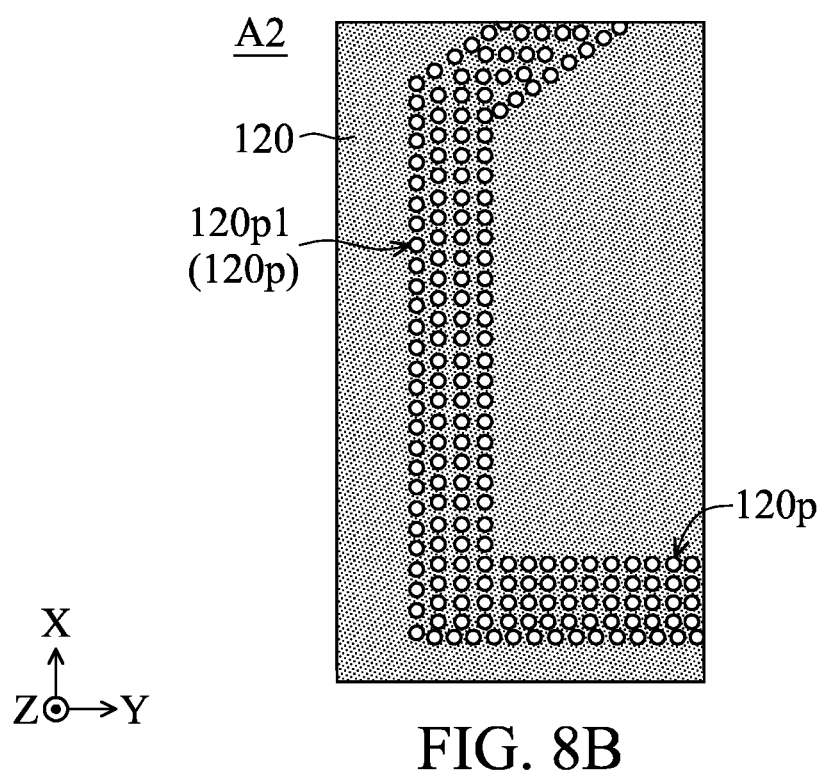
FIG. 8B is an enlarged structural diagram of region A2 of FIG. 8A in accordance with some embodiments of the present disclosure.

Next, please refer to FIG. 7A, FIG. 7B, FIG. 8A and FIG. 8B. FIG. 7A and FIG. 8A are top-view diagrams of the light-shielding layer 120 of the electronic device 10 in accordance with some embodiments of the present disclosure. FIG. 7B and FIG. 8B are respectively enlarged structural diagrams of region A1 of FIG. 7A and region A2 of FIG. 8A in accordance with some embodiments of the present disclosure. Specifically, FIG. 7A and FIG. 7B are schematic structural diagrams of the icon area 120I before an edge processing, and FIG. 8A and FIG. 8B are schematic structural diagrams of the icon area 120I after an edge processing.

As shown in FIG. 7A and FIG. 7B, in accordance with some embodiments, a plurality of openings 120p defining the contour of the pattern may be further formed on the edge of the pattern of the icon area 120I (for example, the openings 120p located in the outermost circle or the innermost circle in the area A1), so that the contour of the pattern can be clearer. However, there may be obvious gaps between the plurality of openings 120p defining the contour of the pattern and the adjacent openings 120p.

As shown in FIG. 8A and FIG. 8B, in accordance with some embodiments, an equidistant process may be performed to the icon area 120I. Specifically, after a plurality of openings 120p defining the contour of the pattern are formed around the periphery of the pattern of the icon area 120I, the pitches P between the openings 120p located at the periphery of the pattern may be adjusted to improve the consistency of the pitches P. For example, as shown in FIG. 8B, after the equidistant process is performed, the plurality of openings 120p include a plurality of first openings 120p1 arranged equidistantly along the periphery.

To summarize the above, in accordance with the embodiments of the present disclosure, the electronic device includes a light-shielding layer having an icon area, and the openings in the icon area has an aperture ratio in a specific range, so that the icon or logo on the electronic device can be rendered invisible or sent to the background as required. Furthermore, in accordance with some embodiments of the present disclosure, the electronic device can also achieve real-time change of the color of the icon or logo.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Thus, the appended claims are intended to include within their scope such processes, machines, manufacture, compositions of matter, means, methods or steps. Moreover, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
    a light-emitting element;
    a cover plate disposed on the light-emitting element; and
    a light-shielding layer disposed on a side of the cover plate adjacent to the light-emitting element, wherein the light-shielding layer has an icon area, and the light-shielding layer has a plurality of openings in the icon area;
    wherein the plurality of openings have an aperture ratio in the icon area, and the aperture ratio is greater than 0% and less than or equal to 20%,
    wherein the aperture ratio is as shown in the following formula:
    the aperture ratio (%)=a total area of the plurality of openings/(the total area of the plurality of openings+a total area of the light-shielding layer)×100%.

2. The electronic device as claimed in claim 1, wherein at least one of the plurality of openings has a pore diameter, and the pore diameter is between 20 micrometers and 40 micrometers.

3. The electronic device as claimed in claim 1, wherein there is a pitch between two adjacent openings among the plurality of openings, and the pitch is between 85 micrometers and 140 micrometers.

4. The electronic device as claimed in claim 1, wherein the aperture ratio is greater than 0% and less than or equal to 10%.

5. The electronic device as claimed in claim 1, wherein the plurality of openings comprise a plurality of first openings arranged equidistantly along a periphery of the icon area.

6. The electronic device as claimed in claim 1, further comprising:
    a glue layer disposed on a side of the light-shielding layer adjacent to the light-emitting element.

7. The electronic device as claimed in claim 6, wherein the glue layer is a transparent glue layer.

8. The electronic device as claimed in claim 6, wherein the glue layer has a thickness, and the thickness is between 200 micrometers and 1000 micrometers.

9. The electronic device as claimed in claim 1, wherein at least one of the plurality of openings has a top width and a bottom width, and the top width is different from the bottom width.

10. The electronic device as claimed in claim 9, wherein the top width is less than the bottom width.

11. The electronic device as claimed in claim 9, wherein the top width is greater than the width of the bottom width.

12. The electronic device as claimed in claim 1, wherein the light-shielding layer has a thickness, and the thickness is between 1 micrometers and 20 micrometers.

13. The electronic device as claimed in claim 1, wherein the plurality of openings are arranged in a matrix or concentric circles.

14. The electronic device as claimed in claim 1, wherein there is a gap between the light-emitting element and the light-shielding layer.

15. The electronic device as claimed in claim 1, wherein the light-shielding layer is adhered on the light-emitting element.

16. The electronic device as claimed in claim 1, wherein a material of the light-shielding layer comprises black photoresist, black printing ink, black resin, metal, carbon black material, resin material, photosensitive material, or a combination thereof.

17. The electronic device as claimed in claim 1, wherein the light-emitting element comprises a light-emitting diode, an organic light-emitting diode, electroluminescence, or a combination thereof.

18. The electronic device as claimed in claim 1, wherein the light-emitting element is independent of a panel or a backlight source of a panel.

19. The electronic device as claimed in claim 1, wherein an expected transmittance of the cover plate is greater than 0% and less than or equal to 20%, and the expected transmittance is as shown in the following formula:
    the expected transmittance of the cover plate (%)=the aperture ratio×a transmittance of the cover plate.

* * * * *